United States Patent [19]

Vinot

[11] 4,165,540
[45] Aug. 21, 1979

[54] METHOD FOR STORING A BINARY SIGNAL IN A HIGH SPEED FLIP FLOP MEMORY HAVING CONTROLLED MINIMUM CHANGEOVER TIME AND APPARATUS THEREFOR

[75] Inventor: Daniel Vinot, Sucy-en-Brie, France

[73] Assignee: Compagnie Internationale pour l'Informatique Cii-Honeywell Bull (Societe Anonyme), Paris, France

[21] Appl. No.: 857,911

[22] Filed: Dec. 6, 1977

[30] Foreign Application Priority Data

Dec. 28, 1976 [FR] France .............................. 76 39314

[51] Int. Cl.² .............................................. G11C 7/00
[52] U.S. Cl. .................................... 365/190; 365/194; 365/233
[58] Field of Search ................. 365/154, 190, 233, 194

[56] References Cited

U.S. PATENT DOCUMENTS

| | | | |
|---|---|---|---|
| 3,691,536 | 9/1972 | Peterson | 365/233 |
| 3,852,724 | 12/1974 | Schwartz | 365/233 |
| 4,060,794 | 11/1977 | Feldman et al. | 365/233 |

Primary Examiner—Stuart N. Hecker
Attorney, Agent, or Firm—Cameron, Kerkam, Sutton, Stowell & Stowell

[57] ABSTRACT

A method for storing a binary signal in a high speed flip-flop memory. The apparatus includes a clock signal selecting device connected to control a pair of memory elements in cascade. Data is introduced into the first memory element under the control of a first control signal from the clock signal selecting device and is transferred to the second memory element under the control of a second control signal from the clock signal selecting device. A single output of a clock pulse generator is applied via parallel lines, one of which includes a delay element, to a logic gate to provide spaced time pulses which are applied to the clock signal selecting device. The clock signal selecting device includes a pair of two input AND gates, each of which are connected to receive at one input the spaced time pulses and at the second input a clock signal selecting signal derived from the output of a JK flip-flop having its sync input connected to receive the spaced time pulses.

14 Claims, 4 Drawing Figures

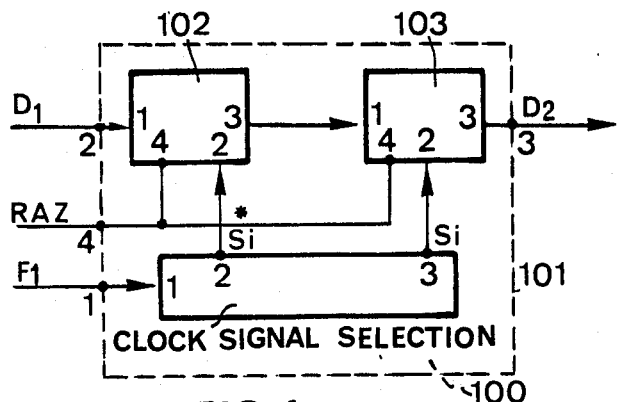
FIG:1
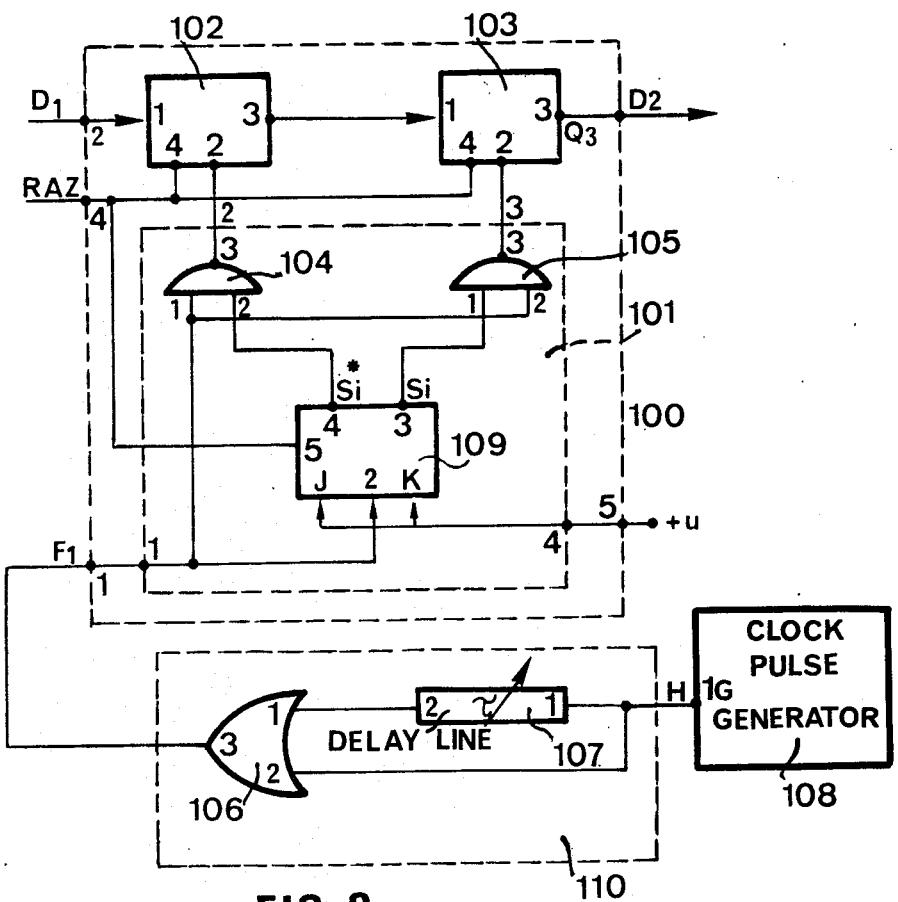
FIG:2

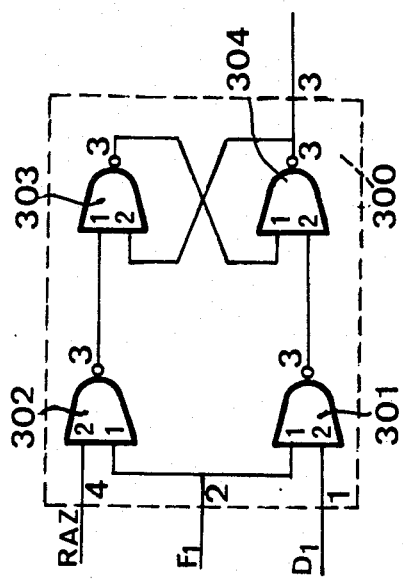
FIG: 3
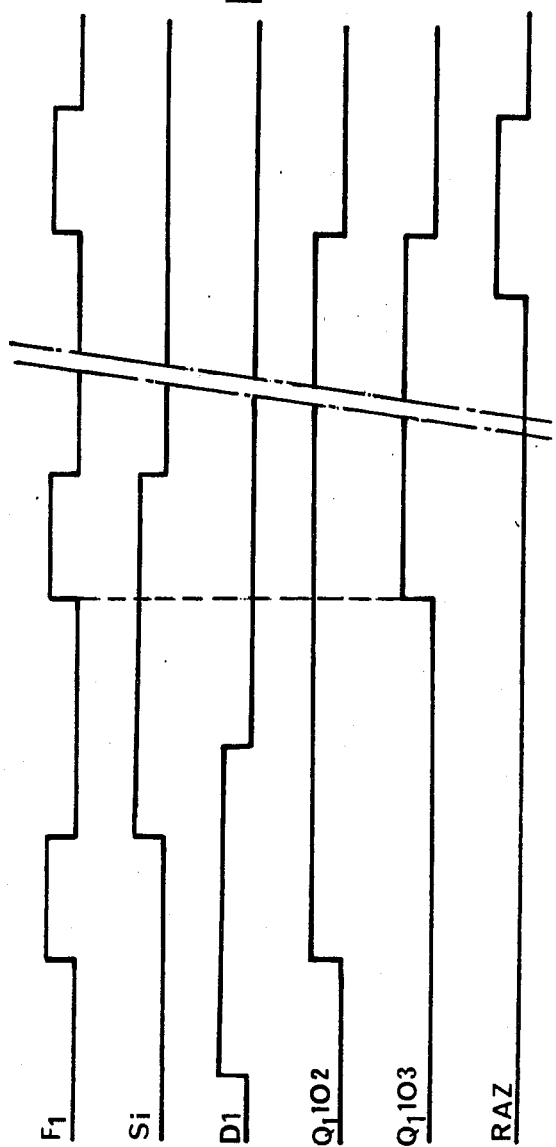
FIG: 4

METHOD FOR STORING A BINARY SIGNAL IN A HIGH SPEED FLIP FLOP MEMORY HAVING CONTROLLED MINIMUM CHANGEOVER TIME AND APPARATUS THEREFOR

BACKGROUND OF THE INVENTION

1. Field of the Invention

The present invention relates to high speed flip-flops and more particularly to a method and arrangement for providing controlled minimum changeover time for high speed flip flops.

2. Description of the Prior Art

A great deal of use is made of flip-flops in producing electronic switching circuits. It is well known that the quality of a flip-flop lies both in being fast, that is to say having a maximum changeover time which is as short as possible, and in ensuring a minimal stable period before changing over.

Prior art constructions consist in using two flip-flops in cascade which are each under the control of specific clock signals which are displaced in time and which are supplied along different lines and are thus passed through different amplifiers which introduce random uncorrelated delays. The drawback of these uncorrelated delays is that they cause a random variation in the time interval which is characteristic of the displacement in time between the two clock signals. In the prior art it was therefore necessary to allow for the worst case which might be brought about by this random effect by increasing the displacement between the timing signals at generation to allow for the maximum reduction in the separation in time between the two clock signals resulting from the passage of each of the two signals through the amplifiers.

SUMMARY OF THE INVENTION

One of the objects of the invention is to produce a flip-flop whose maximum changeover time is as short as possible and whose stable period before changeover is minimal.

Another object of the invention is to produce a flip-flop which is economical to produce and use.

The flip-flop according to the invention uses only a single calibrated clock signal whose setting relative to time is accurately fixed, which means that only one connection is required between the flip-flop and, the circuit for calibrating and generating the clock signal which reduces the number of lines whose lengths have to be made as nearly equal as possible and thus avoids layout problems in the printed circuits on which the generator and the flip-flop are situated.

Another feature of the invention is that it allows use to be made of only a single adjustable parameter which affects the minimum changeover time.

BRIEF DESCRIPTION OF THE DRAWINGS

The advantages of the invention will be better apparent from the description which is given with reference to the accompanying drawings.

FIG. 1 shows an embodiment of flip-flop according to the invention,

FIG. 2 shows an embodiment of flip-flop according to the invention connected to a clock signal generating device, FIG. 3 shows a memory element used to produce the high-speed flip-flop according to the invention.

FIG. 4 is a time diagram showing the times of changeover of the various parts of the high-speed flip-flop according to the invention.

DESCRIPTION OF THE PREFERRED EMBODIMENT

Referring to FIG. 1, the flip-flop 100 comprises two memory elements 102 and 103 and a clock signal selecting device 101. The memory elements 102 and 103 are of the type shown in FIG. 3 inside the rectangle 300 outlined by dash lines.

As shown in FIG. 3, each memory element is made up of a set of four two-input NAND gates. The item of data $D_1$ to be memorized is applied to input terminal 1 of memory element 300 and to input 2 of NAND gate 301. The clock signal $F_1$ is applied to input terminal 2 of memory element 300 and to the respective inputs 1 of NAND gates 301 and 302. The zero-reset signal RAZ is applied to input terminal 4 of memory element 300 and to input 2 of NAND gate 302.

The effect of the application of a zero reset signal will first be described. When the clock signal and the zero-reset signal go high and are present simultaneously at the inputs of NAND gate 302 (both at 1), the output 3 of NAND gate 302 goes low or to the binary 0 state. This state is transmitted to input 1 of NAND gate 303, thus causing the output 3 of gate 303 to assume the 1 state.

The output 3 of gate 303 is connected to input 1 of NAND gate 304, which receives at its input 2 the output signal from NAND gate 301. If the item of data $D_1$ present at input 1 of element 300 is low or in the 0 state, output 3 of gate 301 is in the 1 state and this state is transmitted to input 2 of NAND gate 304. Under these conditions the RAZ signal causes the output 3 of NAND gate 304, and the output 3 of memory element 300 which is directly connected to it, to go to the 0 state. This state is then transmitted to input 2 of NAND gate 303, thus causing its output 3 to go to the 1 state. The effect of signal RAZ being applied to input 4 of memory element 300 is thus to reset memory element 300 to zero.

The storage of an item of data will now be described. After a zero-reset, the simultaneous application of a clock signal $F_1$ and an item of data $D_1$ in the 1 state to inputs 1 and 2 respectively of NAND gate 301 force both its output 3, and the input 2 of gate 304 which is directly connected to it, to go to the 0 state. The consequence of this is to changeover memory element 300 to the 1 state. The output 3 of gate 304, and the output 3 of the memory element which is directly connected to it, thus assume the binary 1 state and the item of data $D_1$ is thus stored in memory element 300. To erase this item of data, it will then be necessary for a clock signal $F_1$ and a signal RAZ to be applied simultaneously.

Referring now to FIG. 1, an item of Data $D_1$ to be stored in the flip-flop 100 of the invention is applied via input terminal 2 of the flip-flop 100 to input 1 of memory element 102 and then, once stored in element 102, the item of data $D_1$ is re-transmitted from the output 3 of the element 102 to input 1 of memory element 103 and is stored in it. The output 3 of memory element 103 is connected directly to output terminal 3 of flip-flop 100 which thus duplicates the value of the item of data $D_1$ present at the input terminal 2 of flip-flop 100. The item of data present at the output terminal 3 of flip-flop 300 is identified as $D_2$ in FIG. 1.

The zero reset signal RAZ is applied simultaneously via input terminal 4 of flip-flop 100 to the inputs 4 of memory elements 102 and 103 respectively.

The clock signal selecting device 101 in FIG. 1 receives a clock signal $F_1$ (in the form of two space time pulses corresponding to each clock pulse H) at its input 1, which is connected to the input terminal 1 of flip-flop 100. The function of the device is to convert a pulse of the clock signal $F_1$ into two pulses and to cause them to appear at output terminals 2 and 3 of the clock signal selecting device 101. These pulses are transmitted to the respective inputs 2 of memory elements 102 and 103.

The clock signal selecting device 101 may take a number of different forms.

FIG. 2 shows a preferred embodiment of a flip-flop constructed according to the invention which employs a JK flip-flop 109 as the device for selecting the clock signal and a delay line 107 for delaying the transmission of a clock pulse H.

JK flip-flops are well known in the art and reference may be made to the book "Designing With TTL Integrated Circuits," Texas Instruments Incorporated, Morris and Miller, McGraw Hill Book Company, 1971, pages 168–180.

Delay lines are likewise well known in the art and use may be made of localized constant delay lines (inductance+ capacitance), quartz delay lines, magnetostrictive delay lines (magnetostrictive lines made of ferronickel), or distributed constant delay lines (coaxial delay lines). It is also possible to use a shift register made up of two flip-flops connected in cascade.

In addition to the memory elements 102 and 103 described above, the flip-flop shown in FIG. 2 also includes the clock signal selecting device 101 which is made up of two AND gates 104 and 105, JK flip-flop 109 and a clock pulse generating circuit 110. AND gates 104 and 105 are connected at their inputs 2 and 1, respectively, to two outputs 4 and 3, or S*i and Si respectively, of JK flip-flop 109.

In operation the pulses of the clock signal $F_1$ are applied to the input terminal 1 of the clock signal selecting device 101. The clock pulses are also applied to the 1 and 2 inputs respectively of the AND gates 104 and 105. When the JK flip-flop 109 is in the 0 state, its output S*i is high or in the logic 1 state and enables gate 104 so as to authorize the transfer of a control pulse in response to clock signal $F_1$ through AND gate 104. Si output, however, is low and clock pulses at input 2 of gate 105 are blocked. The control pulse is transmitted from the output 3 of gate 104 to the 2 input of memory element 102 and the item of data $D_1$ at input terminal 2 of flip-flop 100 is transferred into memory element 102.

The pulse of clock signal $F_1$ is also transmitted to the synchronizing input 2 of JK flip-flop 109, and sets JK flip-flop 109 to its high or 1 state at the decaying edge of the first pulse of clock signal $F_1$. Consequently signal Si assumes the logic 1 value whereas the signal S*i assumes the logic 0 value. The consequence of this reversal of states is that the control pulse developed in response to the second pulse of clock signal $F_1$ is transferred via AND gate 105, whose input 1 receives the signal Si emitted from the output of JK flip-flop 109, whereas AND gate 104 is blocked by the presence of a logic 0 at its input 2, which is connected to the S*i output 4 of JK flip-flop 109.

The JK flip-flop 109 has its J and K inputs connected to the supply potential +u to the flip-flop to enable it to changeover to act as a divide-by-two frequency divider.

The RAZ signal applied to input terminal 4 is also applied to input 5 of JK flip-flop 109. The operating process which has just been described is represented by the time diagram in FIG. 4 in which are shown the signals $F_1$, Si, $D_1$, the state $Q_1$ 102 of the output 3 of memory 102 and the state $Q_1$ 103 of memory element 103, and also the signal RAZ.

Referring again to FIG. 2, it can be seen that the signal $F_1$ comprises spaced time pulses generated by circuit 110 in response to each clock pulse H derived from clock pulse generator 108.

The circuit for generating spaced time pulses on clock signal $F_1$ is made up of an OR gate 106. Output 3 of OR gate 106 is connected to the input terminal 1 of flip-flop 100 to apply thereto the clock signal $F_1$. The input 1 of OR gate 106 is connected to the output 2 of a delay line 107 whose delay time is adjustable. This delay line may be conventional as noted above and may take the form of localized constant delay lines (inductance+capacitance), quartz delay lines, magnetostrictive delay lines, or distributed constant delay lines. Use may also be made of a shift register formed from n flip-flops.

In FIG. 2, the input 2 of OR gate 106 is connected to the output 1 of a clock pulse generator 108 which emits a series of pulses H. Similarly, input 1 of delay line 107 is connected to the output 1 of the clock pulse generator 108. With this arrangement, a clock pulse emitted by clock signal generator 108 appears for a first time directly at the output 3 of OR gate 106 and a second time after it has travelled through the delay line 107.

The method and arrangement of the invention which have just been described represent only one possible embodiment of the invention and it is clear that those skilled in the art of producing electronic and electrical switching circuits will be capable of designing other possible embodiments of the invention without departing from the scope of the claims.

I claim:

1. A method for storing the value of a binary signal in a memory device including two memory elements in cascade comprising applying the binary signal to be stored into a first memory element under the control of a first control signal, transferring the stored binary signal from the first memory element to a second memory element under the control of a second control signal, generating from a single clock pulse a clock signal comprising a first and a second pulse which are spaced in time, generating said first control signal for selectively controlling said first memory element in response to the first clock signal pulse, generating said second control signal for selectively controlling the said second memory element in response to the second clock signal pulse, and applying said first control signal to said first memory element and said second control signal to said second memory element to thereby cause said binary signal to be stored in the memory device.

2. A high speed flip-flop memory device for storing a binary signal comprising a first and a second memory element connected in cascade, means for introducing the binary signal to be stored in the memory device into said first memory element under the control of a first control signal, means for transferring the binary signal from said first memory element to said second memory element under the control of a second control signal, means for generating, from a single pulse, a clock signal comprising two pulses which are displaced in time, means responsive to the time displaced pulses generated by the first means for generating said first and second control signal and means for applying the first control signal and the second control signal to the said first and second memory elements respectively to thereby cause said binary signal to be stored in said memory device.

3. A device for storing binary signals according to claim 2, wherein said means for generating a clock signal to is a localized constant delay line.

4. A device for storing a binary signal according to claim 2, wherein said means for generating a clock signal is a delay line of the magnetostrictive type.

5. A device for storing a binary signal according to claim 2, wherein said means for generating a clock signal is a piezoelectric delay line.

6. A device for storing a binary signal according to claim 2, wherein said means for generating a clock signal is a shift register comprising flip-flops connected in series.

7. A device for storing a binary signal according to claim 2, wherein said means for generating a clock signal is a delay line which converts the single clock pulse into two clock pulses adapted to control the first and second memory elements respectively.

8. A device for storing a binary signal according to claim 2, wherein said means responsive to the two pulses is a JK flip-flop controlled by the signals supplied by said pulse generating means.

9. A device for storing a binary signal according to claim 2, wherein said means for applying the control signals comprises a first and a second AND gate, each gate being connected to receive the said clock signal generated at a first input and a control signal at a second input such that said AND gates control the said first and second memory elements from their respective outputs.

10. A high speed flip-flop memory device for storing a binary signal comprising a clock signal selecting device connected to control a pair of memory elements arranged in cascade in response to a first and a second control signal, means for introducing data information into the first memory element under the control of said first control signal from the clock signal selecting device and transferring said data information to the second memory element under the control of said second control signal from the clock signal selecting device, a clock pulse generator, means for applying a single output of the clock pulse generator via parallel lines, to a logic gate, a delay element in one of said lines to delay the single output applied along that line so as to provide spaced time pulses to separate inputs of said logic gate, and means connecting the output of the logic gate to the clock signal selecting device whereby the spaced time pulses are received at an input of the clock signal selecting signal, said clock signal selecting device including logic means for generating said first and said second control signals in response to said spaced time pulses to thereby cause said binary signal to be stored in said memory device.

11. A memory as set forth in claim 10 wherein said clock signal selecting device includes a pair of two input AND gates, each of which is connected to receive at one of its input the spaced time pulses applied to the input of said selecting device, and a JK flip-flop, the outputs of said JK flip-flop being connected to the other inputs of said AND gates and means connecting the sync input of said JK flip-flop to receive the spaced time pulses applied to the input of said selecting device.

12. A memory according to claim 10, wherein said delay element is a localized constant delay line.

13. A memory according to claim 10, wherein said delay element is a delay line of the magnetostrictive type.

14. A memory according to claim 10, wherein said delay element is a piezolectric delay line.

* * * * *